(12) United States Patent
Liu (10) Patent No.: US 11,316,026 B2
(45) Date of Patent: Apr. 26, 2022

(54) RECESSED CHANNEL STRUCTURE IN FDSOI

(71) Applicant: Taiwan Semiconductor Manufacturing Co., Ltd., Hsin-Chu (TW)

(72) Inventor: Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 290 days.

(21) Appl. No.: 16/420,469

(22) Filed: May 23, 2019

(65) Prior Publication Data

US 2020/0044039 A1 Feb. 6, 2020

Related U.S. Application Data

(60) Provisional application No. 62/712,421, filed on Jul. 31, 2018.

(51) Int. Cl.
*H01L 29/423* (2006.01)
*H01L 27/12* (2006.01)
(Continued)

(52) U.S. Cl.
CPC .......... *H01L 29/4236* (2013.01); *H01L 21/84* (2013.01); *H01L 27/1203* (2013.01);
(Continued)

(58) Field of Classification Search
CPC ......... H01L 29/42356; H01L 29/42376; H01L 29/66545; H01L 29/66621;
(Continued)

(56) References Cited

U.S. PATENT DOCUMENTS

| 7,804,130 | B1 * | 9/2010 | Fung ...................... H01L 27/11 257/330 |
| 2013/0248985 | A1 | 9/2013 | Amarnath et al. |

(Continued)

OTHER PUBLICATIONS

Brown et al. "Intrinsic Parameter Fluctuations in Nanometre Scale Thin-Body SOI Devices Introduced by Interface Roughness." Superlattices and Microstructures 34 (2003) 283-291, published in 2003.

*Primary Examiner* — Marcos D. Pizarro
(74) *Attorney, Agent, or Firm* — Eschweiler & Potashnik, LLC (57) ABSTRACT

An integrated circuit includes a SOI substrate comprising a base substrate, an insulator layer, and a semiconductor device layer. Source and drain regions in the semiconductor device layer are spaced apart by a channel region in the semiconductor device layer. A gate electrode is disposed over the channel region and has a bottom surface that extends below a top surface of the semiconductor device layer. A sidewall spacer structure extends along outer sidewalls of the gate electrode and has a bottom surface that rests on the top surface of the semiconductor device layer. A gate dielectric separates the channel region from the bottom surface of the gate electrode and contacts the bottom surface of the sidewall spacer structure. The channel region beneath the bottom surface of the gate electrode corresponds to the semiconductor device layer and has a thickness of less than 40 angstroms.

20 Claims, 6 Drawing Sheets (51) Int. Cl.
  *H01L 29/66* (2006.01)
  *H01L 21/84* (2006.01)
  *H01L 29/786* (2006.01)
  *H01L 29/78* (2006.01)

(52) U.S. Cl.
  CPC .. *H01L 29/42356* (2013.01); *H01L 29/42368* (2013.01); *H01L 29/42376* (2013.01); *H01L 29/66545* (2013.01); *H01L 29/66621* (2013.01); *H01L 29/66636* (2013.01); *H01L 29/66772* (2013.01); *H01L 29/7848* (2013.01); *H01L 29/78603* (2013.01); *H01L 29/78618* (2013.01); *H01L 29/78654* (2013.01); *H01L 29/78657* (2013.01)

(58) Field of Classification Search
  CPC ........... H01L 29/66636; H01L 29/7848; H01L 29/42368; H01L 29/66772; H01L 29/78618; H01L 29/78657
  See application file for complete search history.

(56) References Cited

U.S. PATENT DOCUMENTS

2014/0159142 A1  6/2014  Lim et al.
2014/0167164 A1  6/2014  Adam et al.

\* cited by examiner

Fig. 1A
*Cross-sectional view*

Fig. 1B
*Top view*

RECESSED CHANNEL STRUCTURE IN FDSOI

REFERENCE TO RELATED APPLICATION

This application claims the benefit of U.S. Provisional Application No. 62/712,421, filed on Jul. 31, 2018, the contents of which are hereby incorporated by reference in their entirety.

BACKGROUND

The semiconductor manufacturing industry has experienced exponential growth over the last several decades. In the course of semiconductor evolution, the minimum feature size for semiconductor devices has decreased over time, thereby helping to increase the number of semiconductor devices per unit area on successive generations of integrated circuits (ICs). This device "shrinkage" allows engineers to pack more devices and more corresponding functionality onto newer generations of ICs, and is consequently one of the underlying drivers of the modern digital age. Another advancement that has helped improve the functionality of ICs in recent years has been to replace traditional polysilicon gates with metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 through 13A-13B illustrate a series of cross-sectional views of some embodiments for manufacturing an IC with a recessed channel structure in FDSOI.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typical transistors in today's CMOS system on chip are formed on a bulk silicon substrate, meaning that the transistors are formed over a substrate that consists of a single monocrystalline silicon layer. Aspects of the present disclosure lie in the appreciation that a fully depleted semiconductor on insulator (FDSOI) substrate (which includes a relatively thick semiconductor base substrate, an insulator layer over the base substrate, and a relatively thin semiconductor device layer over the insulator layer) reduces substrate leakage compared to a bulk silicon substrate. Because of this, ICs formed on an FDSOI substrate provide improved performance over ICs formed on traditional bulk silicon substrates.

More particularly, for transistors formed on FDSOI substrates, until now it has been difficult to scale the thickness of the device layer for FDSOI substrates. As appreciated in the present disclosure, transistors formed on an FDSOI substrate have a source region and a drain region which are spaced apart from one another by a channel region, wherein the source region, drain region, and channel region are each disposed in the semiconductor device layer of the FDSOI substrate. Thus, such a transistor is said to have a length (L) that is the shortest distance between outer edges of the gate and/or between nearest edges of the source region and drain region, and a width (W) between outer edges of the gate measured perpendicular to the length. As successive technology nodes are developed, transistors on ICs shrink—meaning the length and width of a minimum size transistor are typically reduced so the number of transistors that fit into a unit area doubles every approximately 18 months. To properly scale the channel and/or gate length (L), aspects of the present disclosure appreciate that it is desirable to also scale the thickness of the semiconductor device layer in the channel region of the transistor along with the channel/gate length scaling. For example, in some cases, the thickness of the semiconductor device layer in the channel region of a transistor is scaled to be less than 40 angstroms. Scaling the channel thickness in this manner can improve device performance, such as an Ion/Ioff ratio for the transistor, sub-threshold voltage swing, and/or other characteristics.

Figure 1A:
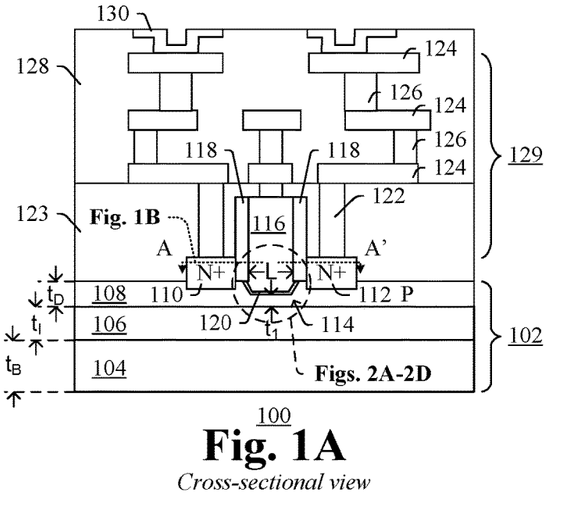
FIG. 1A illustrates a cross-sectional view of some embodiments of an integrated circuit (IC) with a recessed channel structure in FDSOI.
Figure 1B:
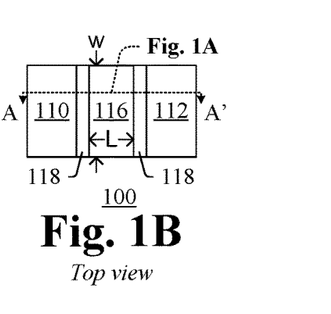
FIG. 1B illustrates a top view of some embodiments of an integrated circuit (IC) with a recessed channel structure in FDSOI.

FIG. 1A illustrates a cross-sectional view of an integrated circuit (IC) 100 with a transistor in accordance with some embodiments, while FIG. 1B illustrates a top view of the IC showing a width (w) and length (L) of the transistor. As can be seen in FIG. 1A, the IC includes a FDSOI substrate 102 comprising a base substrate 104, an insulator layer 106 over the base substrate 104, and a semiconductor device layer 108 over the insulator layer 106. In some embodiments, the semiconductor device layer 108 comprises monocrystalline silicon, and has a maximum thickness $t_D$ ranging from 40 angstroms to 100 angstroms. The insulator layer 106 can comprise silicon dioxide, and can have a thickness $t_I$ ranging from 50 angstroms to several microns. The base substrate 104 can comprise monocrystalline silicon and is typically thicker than the semiconductor device layer 108 and can have a thickness $t_B$ ranging, for example, from 400 microns to 800 microns.

A source region 110 and a drain region 112 are disposed in the semiconductor device layer 108 and are spaced laterally apart from one another by a channel region 114 in the semiconductor device layer 108. The source region 110 and the drain region 112 have a first conductivity type (e.g., n-type), while the channel region 114 has a second conductivity type (e.g., p-type) opposite the first conductivity type. In some embodiments, the source region 110 and drain region 112 comprise a strain inducing epitaxial material. For example, in some embodiments where the source region 110 and drain region 112 are n-type, the source region 110 and drain region 112 comprise silicon phosphorous (SiP) and have a thickness ranging from 10 angstroms to 1000 angstroms. In other embodiments where the source region 110 and drain region 112 are p-type, the source region 110 and drain region 112 comprise silicon germanium (SiGe) and have a thickness ranging from 10 angstroms to 1000 angstroms.

A gate electrode 116, such as a metal or polysilicon gate electrode, overlies the channel region 114. A gate dielectric 120 separates the channel region 114 from the gate electrode 116. A sidewall spacer structure 118 is disposed along outer sidewalls of the gate electrode 116. Contacts 122 extend through an inter-layer dielectric (ILD) 123, such as silicon dioxide or low-k dielectric material, and metal lines 124 and vias 126 extend through a dielectric structure 128, such as an inter-metal dielectric (IMD) made of silicon dioxide or low-k dielectric material, to form an interconnect structure 129 over the FDSOI substrate 102. A redistribution layer (RDL) structure and/or bond pads 130 are then formed over the interconnect structure 129, and are often encapsulated by a passivation layer and/or molding layer (not shown). In some embodiments, the contacts 122 comprise nickel or tungsten; the metal lines 124 and vias 126 comprise copper or copper alloy; and the bond pads 130 comprise aluminum. Further, in some embodiments, the gate electrode 116 has an upper surface that is level with an upper surface of the sidewall spacer structure 118.

Notably, the channel region 114 is recessed for at least some portions between the source region 110 and drain region 112. Thus, in this recessed region, the gate dielectric 120 and gate electrode 116 "dip" down so the semiconductor device layer 108 has a reduced thickness, $t_1$, in the channel region, such that $t_1$ is less than the maximum thickness $t_D$ of the semiconductor device layer 108. Scaling the channel thickness in this manner can improve device performance, such as an Ion/Ioff ratio for the transistor, sub-threshold voltage swing, and/or other characteristics. For example, in various embodiments, the semiconductor device layer 108 is a monocrystalline silicon layer having a maximum thickness of approximately 70 nanometers, which is thicker than some other approaches, and the channel has a thickness of less than 40 angstroms (e.g., $t_1$ has been recessed to be less than $t_D$), which can improve the device performance characteristics relative to traditional bulk substrate transistors.

Referring to FIGS. 2A-2D, one can see various inset views that can be superimposed on the corresponding section of FIG. 1A. In FIGS. 2A-2D, the channel region 114 includes a central channel region 115, a first peripheral channel region 117a separating the source region 110 from the central channel region 115, and a second peripheral channel region 117b separating the drain region 112 from the central channel region 115. The central channel region 115 has an upper surface 206 which corresponds to a recessed upper surface of the semiconductor device layer 108 and which is recessed relative to a top surface 108t of the peripheral channel regions. Thus, the semiconductor device layer 108 has a first (reduced) thickness, t1, in the central channel region 115 and a second thickness t2 in the peripheral channel regions 117a, 117b. The first thickness t1 is less than the second thickness t2. In some embodiments, the second thickness is equal to the maximum thickness $t_D$ of the semiconductor device layer 108, but the second thickness t2 can also be less than the maximum thickness $t_D$.

The sidewall spacer structure 118 is disposed along outer sidewalls of the gate electrode 116. The sidewall spacer structure 118 has a bottom surface 118b that rests on the top surface 108t of the peripheral channel regions 117a, 117b. Thus, a bottom surface of the sidewall spacer structure has outer regions 118o resting on the upper surface of the peripheral channel regions 117a, 117b, and has overhang regions 119 extending inwardly past the top surface 108t of the peripheral channel regions. The sidewall spacer structure 118 can comprise silicon nitride (e.g., $Si_3N_4$), silicon oxynitride (e.g., $Si_2N_2O$), silicon carbide (e.g., SiC), or silicon oxycarbonnitride, and can have a thickness ranging from 10 angstroms to 500 angstroms.

A gate dielectric 120, such as silicon dioxide ($SiO_2$) or a high-k dielectric, is disposed over the channel region 114 and separates the channel region 114 from the bottom surface of the gate electrode 116. The gate dielectric 120 contacts the bottom surface 118b of the sidewall spacer structure and extends to a depth that is below the top surface 108t of the semiconductor device layer (see FIGS. 2A-2D). The gate dielectric 120 includes a peripheral dielectric region whose upper surface contacts the sidewall spacer structure 118, and a central dielectric region whose upper surface is at a first height less than a second height of the peripheral dielectric region.

A gate electrode 116 is disposed over the channel region 114. The gate electrode 116 has a bottom surface 116b (see FIGS. 2A-2D) that extends below a top surface 108t of the semiconductor device layer 108. The gate electrode 116 has a central region disposed on the upper surface of the central channel region 115, and has a peripheral region 116p over the peripheral channel regions 117a, 117b. In some embodiments, the gate electrode 116 is a metal, such as copper or copper alloy, aluminum, tungsten, nickel, or gold, for example. The peripheral region 116p of the gate electrode extends under the overhang regions 119 of the sidewall spacer structure 118.

In various embodiments, the FDSOI substrate 102 is a fully depleted SOI (FDSOI) substrate, which means that the semiconductor device layer 108 is sufficiently thin, such that during operation, a depletion region in the channel region 114 extends fully across the depth of the semiconductor device layer 108. For example, in various embodiments, the semiconductor device layer 108 is a monocrystalline silicon layer having a thickness ranging from 5 nm to 40 nm, and being approximately 10 nm to 12 nm thick in some cases;

and the insulator layer 106 is a silicon dioxide or sapphire layer having a thickness ranging from 10 nm to 60 nm, and being approximately 25 nm thick in some cases, which can provide FDSOI functionality. In contrast, a partially depleted SOI transistor has a semiconductor device layer that is thicker than that of a FDSOI substrate so the depletion region of the channel region extends only partially through the semiconductor device layer in the PDSOI substrate (e.g., through less than 100% of the thickness of the semiconductor device layer in the PDSOI substrate). By recessing the channel to a thickness of less than 40 angstroms (e.g., $t_1$ has been recessed to be less than $t_D$), the device performance characteristics can be improved relative to traditional bulk substrate transistors.

Figure 2A:
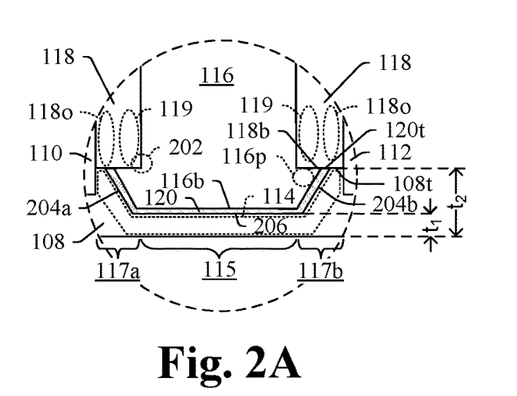
FIG. 2A illustrates a cross-sectional enlarged view of some embodiments of an IC with a recessed channel structure in FDSOI.

In FIG. 2A, the sidewall spacer structure 118 has sharp inner lower corners 202 in which the lower surfaces and sidewall surfaces of the sidewall spacer structure are planar and meet at a 90-degree angle. The gate dielectric 120 is relatively thin, and extends conformally along a recessed surface in the semiconductor device layer 108 over the channel region 114. This recessed surface has a peripheral region with angled sidewalls 204a, 204b and a central region with a bottom surface 206 that is generally level or planar. The angled sidewalls meet the central region at an obtuse angle that is greater than 90-degrees, and a vertex of the obtuse angle (point where the central region meets an angled sidewall) resides under the sidewall spacer structure 118, due to undercutting in the etch used to form the recessed surface during gate replacement. Thus, in FIG. 2A, the top surface of the gate dielectric 120t is confined entirely under the bottom surface 118b of the sidewall spacer structure 118, and the gate electrode 116 has a lower peripheral region 116p that encroaches under the sidewall spacer structure 118. An upper surface of the central portion of the gate dielectric (which contacts the bottom gate electrode surface 116b) has a height that is below that of the sidewall spacer structure bottom surface 118b and is below a height corresponding to bottom extents of the source region 110 and drain region 112 in some embodiments.

Figure 2B:
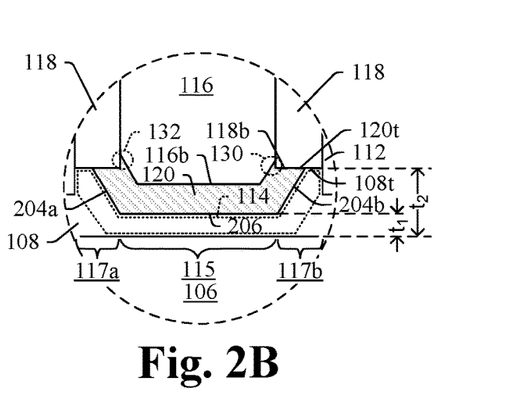
FIG. 2B illustrates a cross-sectional enlarged view of some embodiments of an IC with a recessed channel structure in FDSOI.

In FIG. 2B, the sidewall spacer structure 118 again has sharp inner lower corners in which the lower surfaces and inner sidewall surfaces of the sidewall spacer structure are planar and meet at a 90-degree angle. The gate dielectric in FIG. 2B, however, is relatively thick, and may for example be 10 nm to 50 nm thick, and extends conformally along a recessed surface in the semiconductor device layer 108 over the channel region 114. The angled sidewalls 204a, 204b again meet the central region at an obtuse angle that is greater than 90-degrees, and a vertex of the obtuse angle (point where the central region meets an angled sidewall) resides directly under the sidewall spacer structure 118, due to undercutting in the etch used to form the recessed surface during gate replacement. Thus, in FIG. 2B, the top surface of the gate dielectric 120 extends upwards along the inner sidewall surfaces of the sidewall spacer structure (see 132). An upper surface of the central portion of the gate dielectric (which contacts the bottom gate electrode surface 116b) has a height that is still below that of the sidewall spacer structure bottom surface 118b, but is now above a height corresponding to bottom extents of the source region 110 and drain region 112 in some embodiments.

Figure 2C:
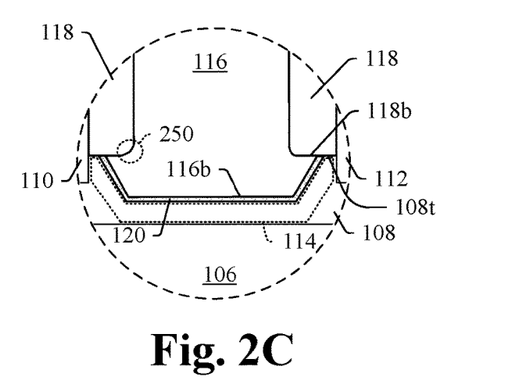
FIG. 2C illustrates a cross-sectional enlarged view of some embodiments of an IC with a recessed channel structure in FDSOI.

In FIG. 2C, the sidewall spacer structure 118 has bottom inner corners with a rounded profile 250, due to undercutting in the etch used to form the recessed surface during gate replacement, but otherwise FIG. 2C corresponds to FIG. 2A.

Figure 2D:
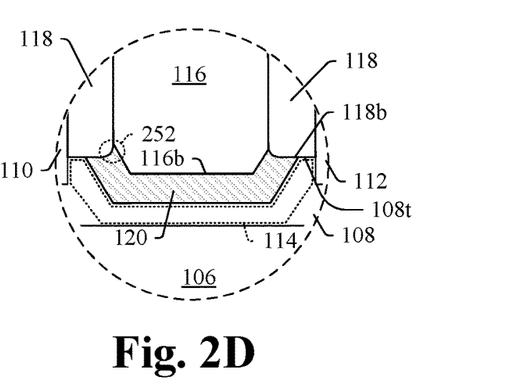
FIG. 2D illustrates a cross-sectional enlarged view of some embodiments of an IC with a recessed channel structure in FDSOI.

In FIG. 2D, the sidewall spacer structure 118 has bottom inner corners with a rounded profile 252, due to undercutting in the etch used to form the recessed surface during gate replacement, but otherwise FIG. 2D corresponds to FIG. 2B.

Figure 3:
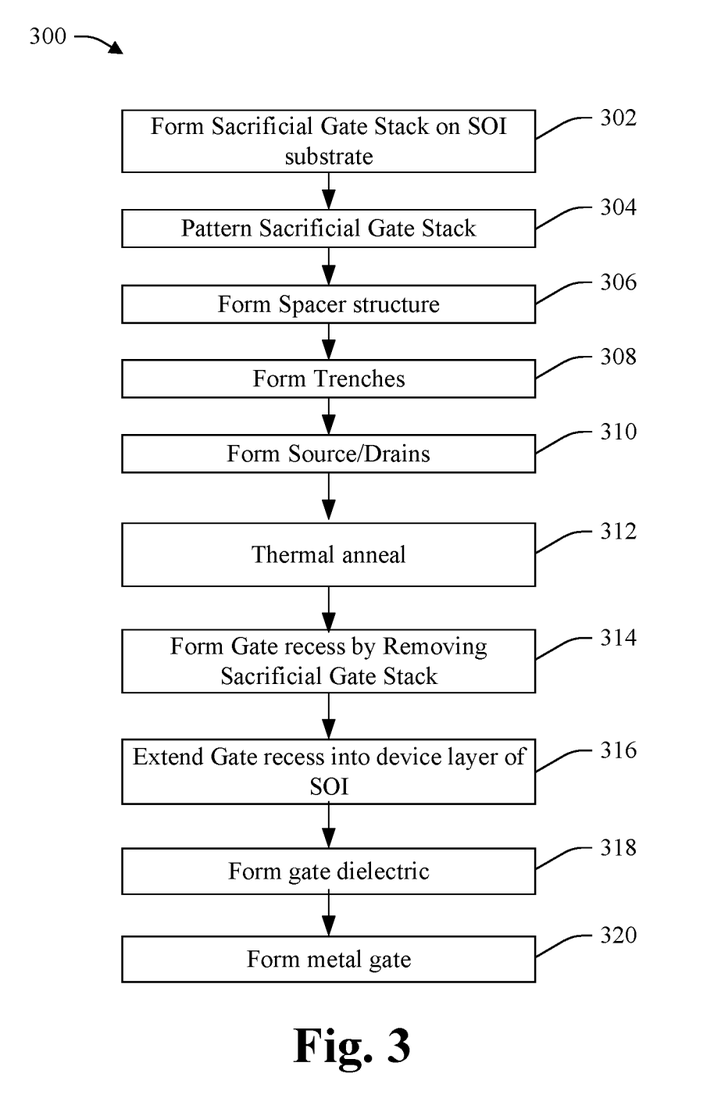
FIG. 3 illustrates a flowchart of some embodiments of a method of forming an IC with a recessed channel structure in FDSOI.

FIG. 3 is a flowchart illustrating a method 300 for fabricating the device. FIGS. 4 through 13A-13B provide cross-sectional views of the device at various stages of fabrication. It should be understood that additional processing may occur before, during, and after the illustrated actions of the method 300 to complete formation of the device.

Figure 4:
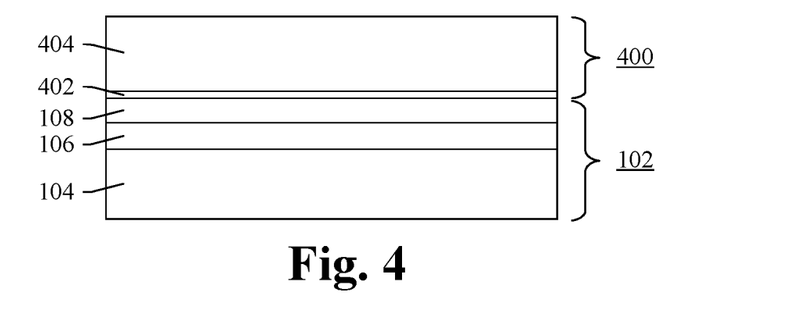

The process 300 begins with act 302, which provides a stack 400 on a semiconductor-on-insulator (SOI) structure, such as shown in FIG. 4 for example. Generally, an SOI structure comprises a semiconductor device layer 108, such as silicon in monocrystalline form, over an insulating layer 106. The semiconductor device layer 108 may alternatively be Ge, SiGe, a group III-V material, or the like. The insulating layer 106 may be, for example, a buried oxide (BOX) layer or a silicon oxide layer. The insulating layer 106 is provided on a base substrate 104, typically a silicon or glass substrate. Other semiconductor bodies, such as a multi-layered substrate or gradient substrate may also be used.

The stack 400 also includes one or more layers provided for a sacrificial gate stack. FIG. 4 provides an example in which the stack 400 includes a dielectric layer 402, and an electrode layer 404. In some embodiments, the dielectric layer 402 comprises silicon dioxide, silicon nitride, silicon oxynitride, or a high-k dielectric. The electrode layer 404 is formed with a sacrificial material such as polysilicon. Thus, the dielectric layer 402 and electrode layer 404 are a sacrificial material, and can be formed using a wide variety of materials that vary depending on the process used.

Figure 5:
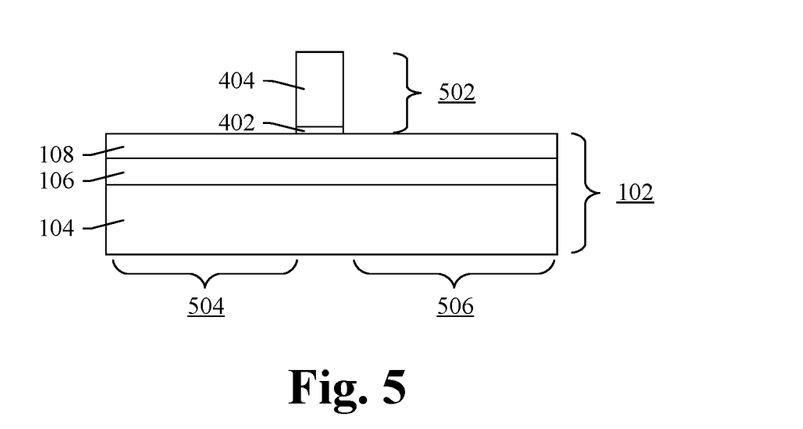

The process 300 of FIG. 3 continues with act 304, patterning the stack 400. FIG. 5 provides an example where the patterning defines locations for the gates 502 and removes the gate stack 400 from over a source region 504 and a drain region 506. Patterning generally includes providing a lithographic mask (e.g., photoresist mask), photolithography to pattern the mask, and etching to transfer the pattern of the mask to underlying layers. The lithographic mask is then removed, resulting in the structure illustrated by FIG. 5.

Figure 6:
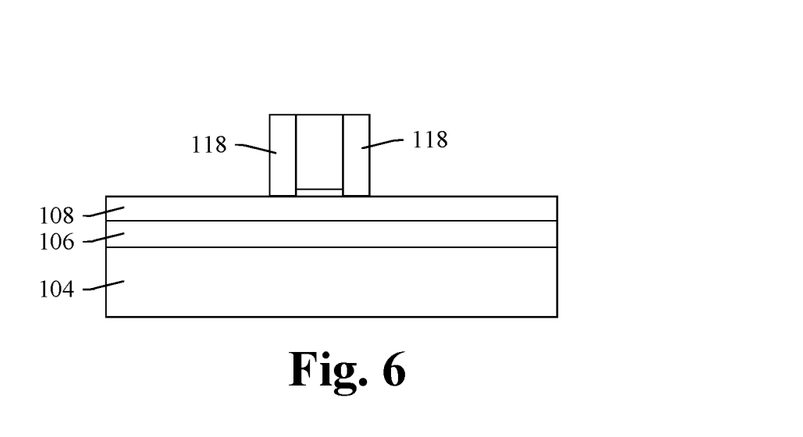

The process 300 continues with act 306, forming a spacer structure adjacent to outer edges of the gates as illustrated by the example of FIG. 6. The spacer structure 118 may be formed by conformally depositing a dielectric layer over the structure of FIG. 5, and then etching back the dielectric layer using a vertical etch. In some embodiments, the spacer structure 118 includes a silicon nitride layer. In alternative embodiments, the spacer structure 118 includes one or more layers of suitable materials. Suitable materials can include, for example, silicon dioxide, silicon nitride, silicon oxynitride (SiON), or silicon carbide (SiC). The spacer material can be deposited using any suitable technique. Suitable techniques may include, for example, plasma enhanced chemical vapor deposition (PECVD), low-pressure chemical vapor deposition (LPCVD), sub-atmospheric chemical vapor deposition (SACVD), and the like. The spacer structure 118 can be patterned by any suitable process, for example, an anisotropic etch.

Figure 7:
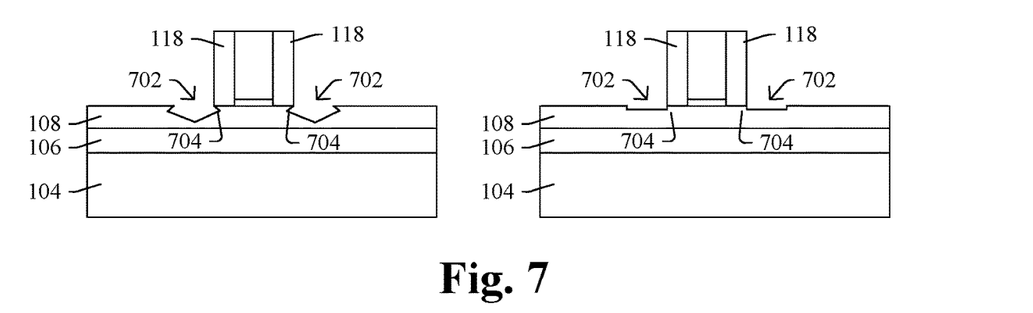

The process 300 continues with act 308, forming trenches 702 in the SOI substrate 102 at desired locations for source and drain regions as illustrated, for example, by FIG. 7.

As shown in the left-side of FIG. 7, in some embodiments, act 308 is an anisotropic wet etch process. An anisotropic wet etch can be a wet etch process that is selective according to crystal surface orientation. The etch can use, for example, tetra-methyl ammonium hydroxide (TMAH) solution in a volume concentration range of 1% to 10% and a temperature in the range from 15° C. to 50° C. This solution is suitable for etching for a monocrystalline semiconductor device layer in some embodiments. The anisotropic etch can produce trenches with tips 704. In some embodiments, the tips 704 are a distance that is 6 nm or less below the top surface 214 of the semiconductor device layer, which will become the surface of the channel region. In some embodiments, the tips 704 are 3 nm or less below the top surface of the semiconductor device layer, for example, 2 nm below. In some embodiments, the trenches can leave a thickness of approximately 25 angstroms of semiconductor device layer 108 in place below a bottom cusp of the trench. The tips may also extend inwardly past outermost edges of the spacers 118 by a distance of 5 angstroms or less in some embodiments.

As shown in the right-side of FIG. 7, in other embodiments, act 308 is an anisotropic dry etch process that produces cuboid-shaped trenches. Generally, the shallower the trenches, the better, and for example, the cuboid trenches can have a depth that is 6 nm or less below the top surface 214 of the semiconductor device layer. In some embodiments, the cuboid trenches can leave a thickness of approximately 25 angstroms of semiconductor device layer 108 in place below a bottom surface of the trench.

In some embodiments of process 300, pocket/halo regions are implanted subsequent to act 308. Pocket regions can be implanted with electrically neutral dopants, for example, that inhibit diffusion of electrically active dopants such as phosphorus. Examples of dopants that can be suitable for this purpose include nitrogen and fluorine. Pocket implants can be formed by any suitable ion implantation process. Alternatively, pocket regions can be formed by implantation of opposite conductivity dopants, such as a p-type dopant for an n-type transistor.

Figure 8:
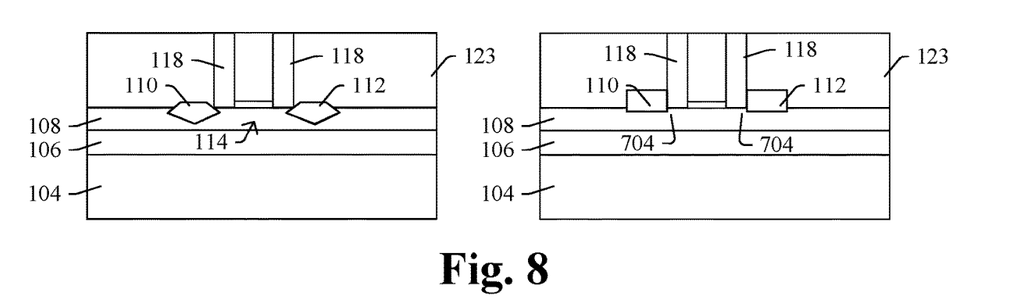

The process 300 of FIG. 3 continues with act 310, forming strain-inducing source/drain regions 110, 112 in trenches 702 to form a structure such as the one illustrated by FIG. 8. The source/drain regions 110, 112 are highly doped to be conductive and place tensile stress on the channel region 114 of the semiconductor device layer 108. This is achieved by forming the source/drain regions 110, 112 from a crystalline material having a lattice structure smaller than that of the channel region. For example, where the channel region is silicon, a source/drain region comprising SiC or SiGe can provide the desired lattice structure. The addition of an n-type or p-type dopant such as phosphorus or boron provides the desired conductivity. The source/drain regions can be formed, for example, by epitaxial growth. Epitaxial growth is generally carried out at a temperature of 690° C. or less. Thermal annealing can then be performed in 312 to drive dopants to achieve a desired doping profile and repair lattice damage, which occurred for example due to ion implantation, and an interlayer dielectric (ILD) 123 can be formed over the source/drain regions, as well as over other portions of the structure. An ILD CMP is then performed to planarize the ILD 123, and stops when an upper surface of the sacrificial gate stack is exposed. As shown in the left-side of FIG. 8, in some embodiments, the strained source/drain regions can have a diamond shape, while in other embodiments shown in the right-side of FIG. 8, the strained source/drain regions can have a cuboid shape, such as a square prism or rectangular prism.

Figure 9:
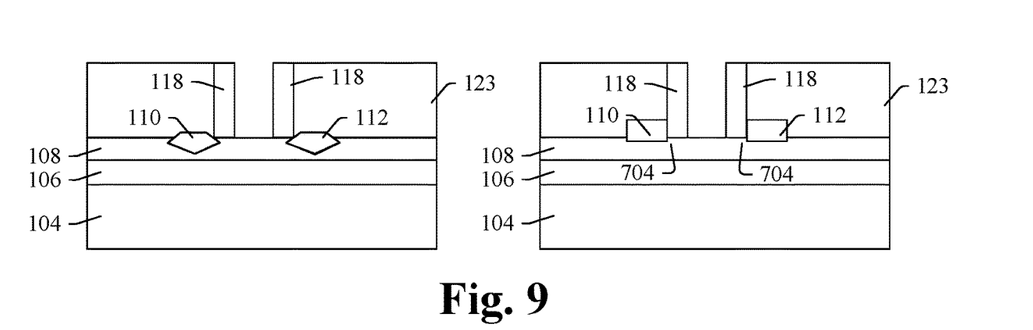

The process 300 of FIG. 3 continues with act 314, forming a gate recess by removing the sacrificial gate stack to form a structure such as the one illustrated by FIG. 9. The gate recess can be formed by performing a selective etch, for example, a dry etch or a dry plus wet etch to remove the sacrificial gate stack and stop on the underlying gate dielectric 402 or device layer 108. In the case of a polysilicon gate stack, Cl2/BCl3 with low power is used in dry selective etch and NH4OH/TMAH is used in wet selectivity etch and stop on gate dielectric 402. Another chemical etchant, such as dilute wet HF or vapor HF for example, is applied to remove the gate dielectric 402 and expose channel region of the device layer 108.

Figure 10:
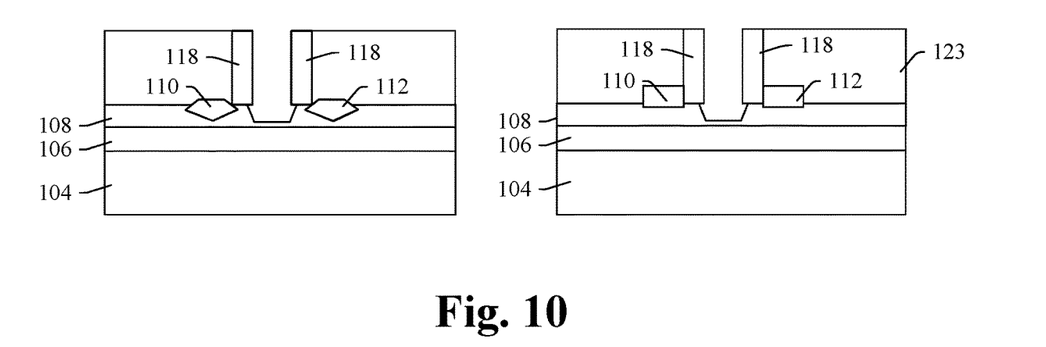

The process 300 of FIG. 3 continues with act 316, extending the gate recess into the semiconductor device layer of the SOI substrate, for example as illustrated by FIG. 10. In some embodiments, extension of the gate recess can be achieve by performing an alkali wet etch. In some embodiments, act 316 is an isotropic wet etch process. The etch can use, for example, tetra-methyl ammonium hydroxide (TMAH) solution in a volume concentration range of 1% to 10% and a temperature in the range from 15° C. to 50° C. In some embodiments, the TMAH can have a volume concentration of between 2% and 3%, such that the wet etch can have an etch rate of approximately 60 angstroms per minute at 100° C. In other embodiments, the alkali wet etch can use an ammonia solution (NH4OH), with an etch rate of approximately 40 angstroms per minute. The etch extends the gate recess downward to thin the semiconductor device layer for example from an initial thickness of 40 angstroms or 70 angstroms to a thinned thickness of less than 40 angstroms or even less than 30 angstroms. Because the etch is isotropic, the etch also undercuts bottom surfaces of the sidewall spacer structure, and provides a recessed surface having angled sidewalls that meet a bottom surface of the recessed surface at an obtuse angle ranging from about 92 degrees to 145 degrees in some embodiments.

Figure 11A:
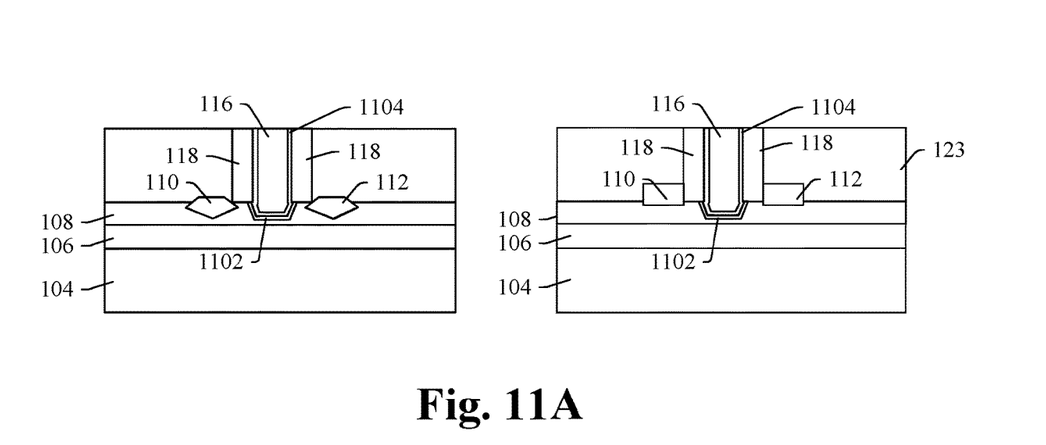

The process 300 of FIG. 3 continues with act 318, forming a replacement gate dielectric 120 on the thinned semiconductor device layer of the SOI substrate, for example as the one illustrated by FIG. 11A. The replacement gate dielectric 120 can be formed by a thermal oxidation process, chemical oxidation, CVD process, PVD process, PECVD process, spin-on dielectric, or other suitable process, which forms a lower gate dielectric 1102. A high-k deposition process is then carried out to form an upper gate dielectric 1104 made of high-k dielectric material that overlays the lower gate dielectric 1102 and lines inner sidewalls of the sidewall spacer structure 118. Thus, in some embodiments, the lower gate dielectric 1102 is made of a first dielectric material, such as silicon dioxide, and the upper gate dielectric 1104 is made of a second dielectric material, such as a high-k dielectric material that differs from that first dielectric material.

Figure 11B:
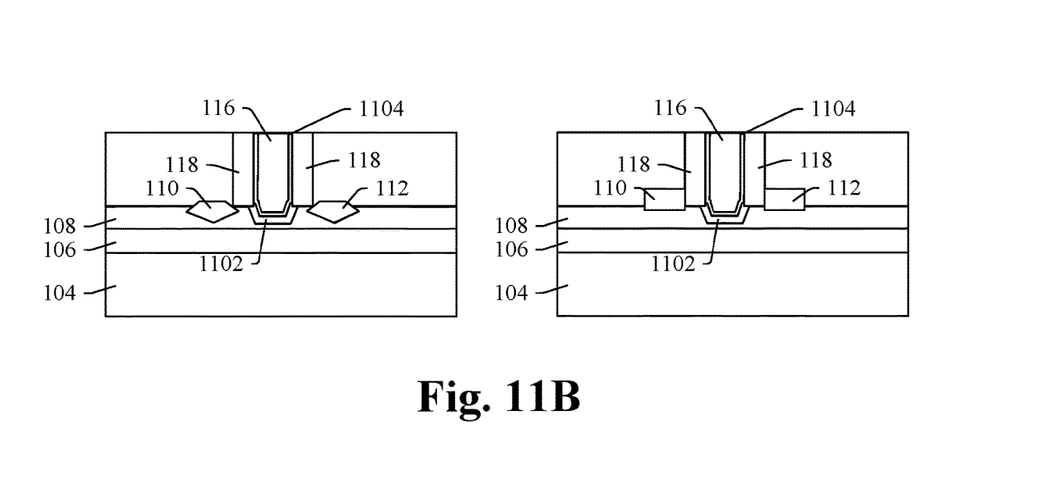

The process 300 of FIG. 3 continues with act 320, forming a gate electrode 116 in the form of a replacement metal gate over the replacement gate dielectric to fill the gate recess, for example as illustrated in FIG. 11A. In some embodiments, such as shown in FIG. 11A, the lower gate dielectric 1102 is relatively thin such that a peripheral region of the gate electrode 116 resides under a bottom surface of the sidewall spacer structure 118. However, in other embodiments, such as shown in FIG. 11B, the lower gate dielectric 1102 is relatively thick such that the gate dielectric extends up along a lower sidewall of the sidewall spacer structure 118.

Figure 12:
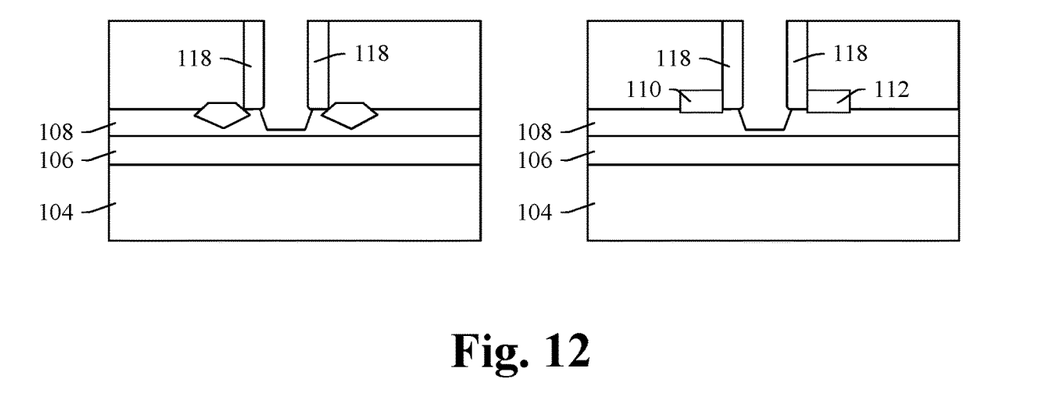
Figure 13A:
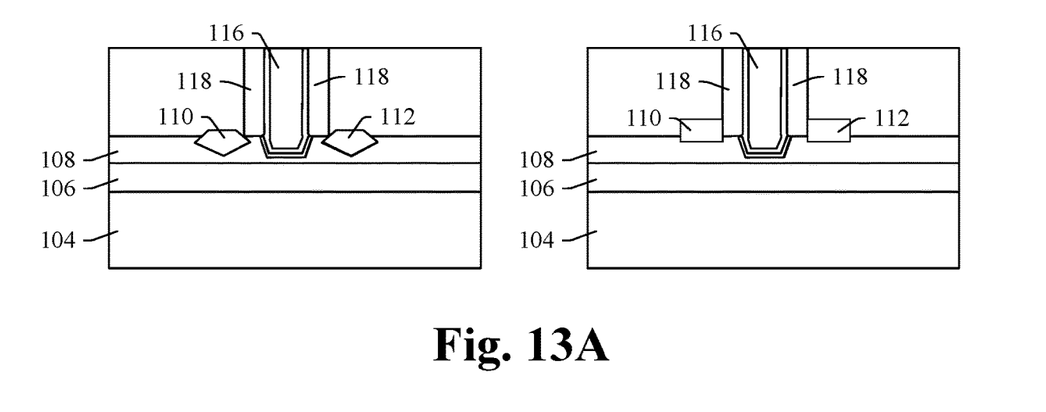
Figure 13B:
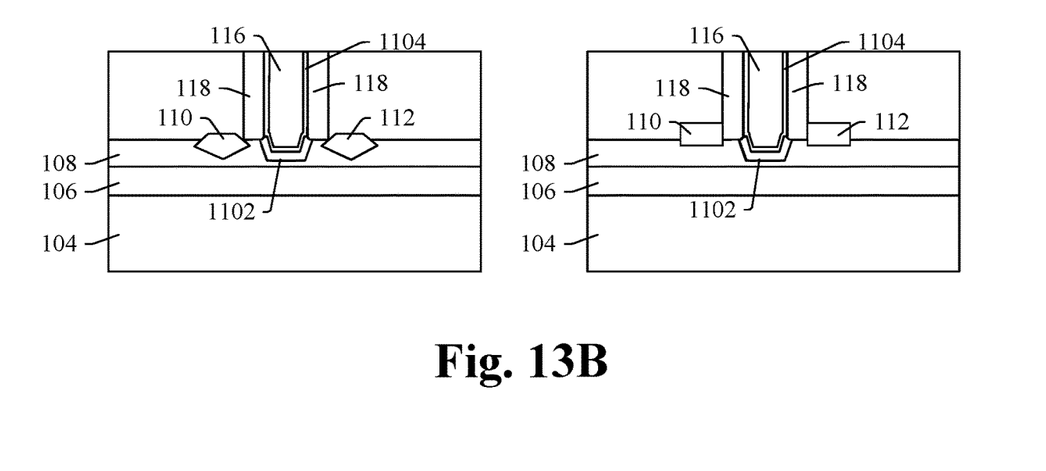

FIG. 12 illustrates an alternate embodiment in which the etch carried out in 316 has a lateral component with regards to the sidewall spacer structure 118, such that the etch of 316 etches the sidewall spacer structure 118 to cause the lower inner corners of the sidewall spacer structure to become rounded. Again, a lower gate dielectric 1102 and upper gate dielectric 1104 are formed on the thinned semiconductor device layer of the SOI substrate, for example as illustrated by FIG. 13A. The replacement gate dielectric 120 can be formed by a thermal oxidation process, chemical oxidation process, CVD process, PVD process, PECVD process, spin-on dielectric, or other suitable process. In some embodiments, such as shown in FIG. 13A, the lower gate dielectric is relatively thin such that a peripheral region of the gate electrode resides under a bottom surface of the sidewall spacer structure 118. However, in other embodiments, such as shown in FIG. 13B, the lower gate dielectric is relatively thick such that the lower gate dielectric extends up along a lower sidewall of the sidewall spacer structure 118.

Some embodiments relate to an integrated circuit (IC) disposed on a semiconductor-on-insulator (SOI) substrate. The SOI substrate comprises a base substrate, an insulator layer over the base substrate, and a semiconductor device layer over the insulator layer. A source region and a drain region are disposed in the semiconductor device layer. The source region and the drain region have a first conductivity type. A channel region is disposed in the semiconductor device layer and separates the source region and the drain region. The channel region has a second conductivity type opposite the first conductivity type. The channel region includes a central region, a first peripheral region separating the source region from the central region, and a second peripheral region separating the drain region from the central region. The central region has an upper surface that is recessed relative to an upper surface of the peripheral regions, such that the semiconductor device layer has a first thickness in the central region of the channel region and a second thickness in the peripheral regions of the channel region. The first thickness is less than the second thickness.

Other embodiments relate to an integrated circuit (IC). The IC includes a semiconductor-on-insulator (SOI) substrate including a base substrate, an insulator layer over the base substrate, and a semiconductor device layer over the insulator layer. A source region and a drain region are disposed in the semiconductor device layer and are spaced apart from one another by a channel region in the semiconductor device layer. A gate electrode is disposed over the channel region. The gate electrode has a bottom surface that extends below a top surface of the semiconductor device layer. A sidewall spacer structure is disposed along outer sidewalls of the gate electrode. The sidewall spacer structure has a bottom surface that rests on the top surface of the semiconductor device layer. A gate dielectric is disposed over the channel region and separates the channel region from the bottom surface of the gate electrode. The gate dielectric contacts the bottom surface of the sidewall spacer structure and extends to a depth that is below the top surface of the semiconductor device layer. The channel region beneath the bottom surface of the gate electrode corresponds to the semiconductor device layer and has a thickness of less than 40 angstroms.

Other embodiments relate to a method for manufacturing an integrated circuit. In this method, a semiconductor-on-insulator (SOI) substrate is received. The SOI substrate comprises a base substrate, an insulator layer over the base substrate, and a semiconductor device layer over the insulator layer. A sacrificial gate stack is formed over the semiconductor device layer, and a sidewall spacer structure is formed about outer sidewalls of the sacrificial gate stack. Trenches are formed in the semiconductor device layer on outer edges of the sidewall spacer structure. A source region and a drain region are epitaxially formed in the trenches. The sacrificial gate stack is removed to form a gate recess between inner sidewalls of the sidewall spacer structure. The gate recess is extended into the semiconductor device layer, wherein the remaining semiconductor device layer under the extended gate recess corresponds to a channel region separating the source region from the drain region. A replacement gate dielectric is formed over the channel region, and a replacement metal gate electrode is formed over the replacement gate dielectric. The replacement metal gate electrode has a bottom surface that extends below a top surface of the semiconductor device layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a semiconductor-on-insulator (SOI) substrate comprising a base substrate, an insulator layer over the base substrate, and a semiconductor device layer over the insulator layer;
a source region and a drain region disposed in the semiconductor device layer and spaced apart from one another by a channel region in the semiconductor device layer;
a gate electrode disposed over the channel region, the gate electrode having a bottom surface that extends below a top surface of the semiconductor device layer;
a sidewall spacer structure disposed along outer sidewalls of the gate electrode, the sidewall spacer structure having a bottom surface that rests on the top surface of the semiconductor device layer; and
a gate dielectric disposed over the channel region and separating the channel region from the bottom surface of the gate electrode, the gate dielectric contacting the bottom surface of the sidewall spacer structure and extending to a depth that is below the top surface of the semiconductor device layer; and
wherein the channel region beneath the bottom surface of the gate electrode corresponds to the semiconductor device layer and has a thickness of less than 40 angstroms.

2. The IC of claim 1, wherein the sidewall spacer structure has bottom inner corners with a rounded profile.

3. The IC of claim 2, wherein the gate electrode has an upper surface that is level with an upper surface of the sidewall spacer structure.

4. The IC of claim 2, wherein the gate dielectric contacts the bottom inner corners of the sidewall spacer structure.

5. An integrated circuit (IC) comprising:
a semiconductor-on-insulator (SOI) substrate comprising a base substrate, an insulator layer over the base substrate, and a semiconductor device layer over the insulator layer;
a source region and a drain region disposed in the semiconductor device layer, the source region and the drain region having a first conductivity type;
a channel region disposed in the semiconductor device layer and separating the source region and the drain region, the channel region having a second conductivity type opposite the first conductivity type, the channel region including a central region, a first peripheral region separating the source region from the central region, and a second peripheral region separating the drain region from the central region, the central region having an upper surface that is recessed relative to an upper surface of the first and second peripheral regions, such that the semiconductor device layer has a first thickness in the central region of the channel region and a second thickness in the first and second peripheral regions of the channel region; and a sidewall spacer structure disposed over the first and second peripheral regions, wherein a bottom surface of the sidewall spacer structure has outer regions resting on the upper surfaces of the first and second peripheral regions, and the bottom surface of the sidewall spacer structure has overhang regions extending inwardly past the upper surface of the first and second peripheral regions, wherein a ratio of first thickness to the second thickness is less than 4:7.

6. The IC of claim 5, wherein the sidewall spacer structure has bottom inner corners with a rounded profile.

7. The IC of claim 5, further comprising:
a gate dielectric disposed over the channel region, the gate dielectric including a peripheral dielectric region whose upper surface contacts the overhang regions, and a central dielectric region whose upper surface is at a first height less than a second height of the peripheral dielectric region.

8. The IC of claim 7, further comprising:
a gate electrode disposed over the gate dielectric and separated from the channel region by the gate dielectric, the gate electrode having a central region disposed on the upper surface of the central dielectric region, and having a peripheral region over the peripheral dielectric region.

9. The IC of claim 8, wherein the upper surface of the peripheral dielectric region is confined entirely below inner regions of the bottom surface of the sidewall spacer structure.

10. The IC of claim 8, wherein the channel region beneath the bottom surface of the gate electrode corresponds to the semiconductor device layer and has a thickness of less than 40 angstroms.

11. An integrated circuit (IC) comprising:
a semiconductor-on-insulator (SOI) substrate comprising a base substrate, an insulator layer over the base substrate, and a semiconductor device layer over the insulator layer;
a source region and a drain region disposed in the semiconductor device layer, the source region and the drain region having a first conductivity type;
a channel region disposed in the semiconductor device layer and separating the source region and the drain region, the channel region having a second conductivity type opposite the first conductivity type, the channel region including a central region, a first peripheral region separating the source region from the central region, and a second peripheral region separating the drain region from the central region, the central region having an upper surface that is recessed relative to an upper surface of the first and second peripheral regions, such that the semiconductor device layer has a first thickness in the central region of the channel region and a second thickness in the first and second peripheral regions of the channel region, the first thickness being less than the second thickness; and a sidewall spacer structure disposed over the first and second peripheral regions, wherein a bottom surface of the sidewall spacer structure has outer regions resting on the upper surfaces of the first and second peripheral regions, and the bottom surface of the sidewall spacer structure has overhang regions extending inwardly past the upper surface of the first and second peripheral regions.

12. The IC of claim 11, wherein the sidewall spacer structure has bottom inner corners with a rounded profile.

13. The IC of claim 11, further comprising:
a gate dielectric disposed over the channel region, the gate dielectric including a peripheral dielectric region whose upper surface contacts the overhang regions, and a central dielectric region whose upper surface is at a first height less than a second height of the peripheral dielectric region.

14. The IC of claim 13, wherein the gate dielectric extends upward along innermost sidewalls of the sidewall spacer structure.

15. The IC of claim 13, further comprising:
a gate electrode disposed over the gate dielectric and separated from the channel region by the gate dielectric, the gate electrode having a central region disposed on the upper surface of the central dielectric region, and having a peripheral region over the peripheral dielectric region.

16. The IC of claim 15, wherein the peripheral region of the gate electrode extends under the overhang regions of the sidewall spacer structure.

17. The IC of claim 15, wherein the peripheral region of the gate electrode resides fully within innermost sidewalls of the sidewall spacer structure.

18. The IC of claim 15, wherein the upper surface of the peripheral dielectric region is confined entirely below inner regions of the bottom surface of the sidewall spacer structure.

19. The IC of claim 15, wherein the channel region beneath the bottom surface of the gate electrode corresponds to the semiconductor device layer and has a thickness of less than 40 angstroms.

20. The IC of claim 15, wherein the gate electrode has an upper surface that is level with an upper surface of the sidewall spacer structure.

* * * * *